US010754197B2

(12) United States Patent
Zhao

(10) Patent No.: US 10,754,197 B2
(45) Date of Patent: Aug. 25, 2020

(54) CORRECTION SYSTEM AND METHOD FOR ALIGNMENT FILM PRINTING PLATE

(71) Applicant: Wuhan China Star Optoelectronics Technology Co., Ltd., Wuhan, Hubei (CN)

(72) Inventor: Kaixiang Zhao, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 21 days.

(21) Appl. No.: 15/522,646

(22) PCT Filed: Feb. 27, 2017

(86) PCT No.: PCT/CN2017/074968
§ 371 (c)(1),
(2) Date: Jun. 29, 2018

(87) PCT Pub. No.: WO2018/148983
PCT Pub. Date: Aug. 23, 2018

(65) Prior Publication Data
US 2018/0299713 A1    Oct. 18, 2018

(30) Foreign Application Priority Data
Feb. 14, 2017    (CN) .......................... 2017 1 0078493

(51) Int. Cl.
*B41F 27/00*     (2006.01)
*G02F 1/1337*    (2006.01)
(Continued)

(52) U.S. Cl.
CPC .............. *G02F 1/1337* (2013.01); *B41F 5/24* (2013.01); *B41F 27/005* (2013.01);
(Continued)

(58) Field of Classification Search
CPC ...................................................... B41F 27/005
(Continued)

(56) References Cited

U.S. PATENT DOCUMENTS

| 4,535,694 A | * | 8/1985 | Fukuda | ..................... B41F 5/16 |
| | | | | 101/111 |
| 5,072,525 A | * | 12/1991 | Philpot | ................. B41F 27/005 |
| | | | | 101/DIG. 36 |

(Continued)

FOREIGN PATENT DOCUMENTS

| CN | 1568257 A | 1/2005 |
| CN | 1614481 A | 5/2005 |

(Continued)

OTHER PUBLICATIONS

International Search Report dated Oct. 26, 2017 for International Patent Application No. PCT/CN2017/074968.

(Continued)

*Primary Examiner* — Anthony H Nguyen

(57) ABSTRACT

Disclosed is a correction system for an alignment film printing plate, including: a roller and a printing plate mounted as a sleeve outside of the roller, wherein a first end portion of the printing plate is provided thereon with a plurality of columns of buckle groups, and a second end portion of the printing plate is provided thereon with a plurality of columns of slot groups engaged with the buckle groups. The correction system for the alignment film printing plate further includes an image controller used for measuring a deviation value between an actual position and a preset position for printing of an alignment film on a substrate. The correcting system of the alignment film printing plate has a simple structure and is capable of realizing different stretching degrees of an alignment film pattern at different positions on the printing plate, so as to improve a correction effect of the printing plate. As a result, (Continued)

deviation can be reduced between an actual position and a preset position for printing of the alignment film on the substrate, without significant increase in costs.

6 Claims, 3 Drawing Sheets

(51) Int. Cl.
*B41F 27/12* (2006.01)
*G03F 9/00* (2006.01)
*B41F 5/24* (2006.01)
*G02F 1/13* (2006.01)

(52) U.S. Cl.
CPC ...... *B41F 27/1218* (2013.01); *B41F 27/1225* (2013.01); *G03F 9/00* (2013.01); *G02F 1/1303* (2013.01); *G02F 1/133723* (2013.01)

(58) Field of Classification Search
USPC .................................................. 101/481
See application file for complete search history.

(56) References Cited

U.S. PATENT DOCUMENTS

| | | | |
|---|---|---|---|
| 5,551,340 A * | 9/1996 | Bolza-Schunemann | B41F 27/1268 101/395 |
| 5,974,972 A * | 11/1999 | Van Denend | B29C 65/5042 101/375 |
| 6,374,735 B1 * | 4/2002 | Satoh | B41F 27/1281 101/376 |
| 6,983,686 B2 * | 1/2006 | Vaughn | B31F 1/07 101/226 |
| 8,359,976 B2 * | 1/2013 | Caliari | B41F 27/005 101/248 |
| 9,266,319 B2 * | 2/2016 | Fukuda | B41F 13/10 |
| 2002/0059878 A1 | 5/2002 | Lotsch | |
| 2004/0060647 A1 * | 4/2004 | Tabora | B26D 1/045 156/258 |
| 2016/0320645 A1 | 11/2016 | Kim et al. | |

FOREIGN PATENT DOCUMENTS

| | | |
|---|---|---|
| CN | 2005181822 A | 7/2005 |
| CN | 101564932 A | 10/2009 |
| CN | 102259473 A | 11/2011 |
| CN | 203705774 U | 7/2014 |
| CN | 105068323 A * | 11/2015 |
| CN | 105068323 A | 11/2015 |
| CN | 204749503 U | 11/2015 |
| CN | 105644135 A | 6/2016 |
| CN | 106166891 A | 11/2016 |
| EP | 0579017 A1 | 1/1994 |

OTHER PUBLICATIONS

Chinese Office Action dated May 25, 2018 for Chinese Patent Application No. 201710078493.4.

* cited by examiner

CORRECTION SYSTEM AND METHOD FOR ALIGNMENT FILM PRINTING PLATE

CROSS-REFERENCE TO RELATED APPLICATIONS

The present application claims the priority of Chinese patent application CN 201710078493.4, entitled "Correction system and method for alignment film printing plate" and filed on Feb. 14, 2017, the entirety of which is incorporated herein by reference.

FIELD OF THE INVENTION

The present disclosure relates to the field of liquid crystal display technologies, and particularly, to a correction system and a method for an alignment film printing plate.

BACKGROUND OF THE INVENTION

In an existing manufacturing procedure of a thin film transistor liquid crystal display screen (TFT-LCD), an alignment film (PI film) is coated on both sides of a thin film transistor substrate and a color film substrate (TFT/CF) in order to allow liquid crystal molecules to have a fixed pretilt angle.

There are mainly two approaches to coat the alignment film on a glass substrate: inkjet and print, wherein a printing plate (APR plate) is usually necessary for print.

The printing plate is made of a resin material. As shown in FIG. 1, with the increase in the number of prints, the resin material will be stretched, leading to deformation of a pattern on the printing plate. An arrow in FIG. 1 indicates a stretching direction. As a result, as the number of prints increases, an operator will observe deformation of the pattern on the printing plate, and move a printing roller integrally to enable integral correction of the pattern on the printing plate. Due to different stretching degrees, a printing start end and a printing end will be different from each other in deviation values of the pattern, as shown in FIGS. 2 to 4, which depict in a direction from the printing start end to the printing end. Different positions have different stretching degrees. However, integral correction causes integral deviation, and thus cannot meet different correction requirements of different printing positions due to the different stretching degrees. Therefore, even if an image on the printing plate is corrected through integral deviation, the pattern of the alignment film at different positions of the printing plate is still subject to different degrees of deviation. Solid lines in FIGS. 1 to 4 indicate original boundaries of the pattern, and dashed lines therein demonstrate boundaries of the pattern after being stretched.

In order to solve the problems in the prior art, it is necessary to provide a new correction system and method for the alignment film printing plate.

SUMMARY OF THE INVENTION

The present disclosure provides a correction system for an alignment film printing plate, which has a simple structure and is capable of realizing different stretching degrees of correction in an alignment film pattern at different positions of the printing plate, so as to improve a correction effect of the printing plate. As a result, deviation can be reduced between an actual position and a preset position for printing of the alignment film on the substrate, without significant increase in costs.

In order to achieve the above objective, the present disclosure provides a correction system for an alignment film printing plate, comprising:

a roller and a printing plate mounted as a sleeve outside of the roller, wherein a first end portion of the printing plate is provided thereon with a plurality of columns of buckle groups, and a second end portion of the printing plate is provided thereon with a plurality of columns of slot groups engaged with the buckle groups; and an image controller used for measuring a deviation value between an actual position and a preset position for printing of an alignment film on a substrate.

In the correction system for the alignment film printing plate as described above, the buckle groups include at least one buckle projection, and the slot groups include at least one buckle recess engaged with the buckle projection.

In the correction system for the alignment film printing plate as described above, wherein the plurality of columns of buckle groups and the plurality of columns of slot groups are provided thereon with scales, respectively.

In the correction system for the alignment film printing plate as described above, the substrate is aligned, at the preset position, with a correction mark provided on the printing plate.

In the correction system for the alignment film printing plate as described above, the first end portion is close to a printing start end, and the second end portion is close to a printing end, the second end portion having a greater stretching degree than the first end portion.

The present disclosure further provides a correction method for an alignment film printing plate. This method is simple and capable of realizing different stretching degrees for an alignment film pattern at different positions on the printing plate, so as to improve a correction effect of the printing plate.

In order to achieve the above objective, the present disclosure provides the correction method for an alignment film printing plate, comprising the following steps:

step S1): measuring an actual position for printing of an alignment film on a substrate, and performing comparison calculation between the actual position and a preset position for printing of the alignment film on the substrate, to obtain a deviation value; and step S2): performing, based on the deviation value, different stretching degrees of correction on an alignment film pattern at different positions of the printing plate.

In the correction method for the alignment film printing plate as described above, the printing plate is mounted as a sleeve outside of a roller, a first end portion of the printing plate being provided thereon with a plurality of columns of buckle groups, and a second end portion of the printing plate being provided thereon with a plurality of columns of slot groups engaged with the buckle groups.

In the correction method for the alignment film printing plate as described above, the substrate is aligned, at the preset position, with a correction mark provided on the printing plate.

In the correction method for the alignment film printing plate as described above, the plurality of columns of buckle groups and the plurality of columns of slot groups are provided thereon with scales, respectively.

In the correction method for the alignment film printing plate as described above, the buckle groups include at least one buckle projection, and the slot groups include at least one buckle recess engaged with the buckle projection.

The correction system and method for the alignment film printing plate of the present disclosure realize adjustment of the alignment film pattern of the printing plate by the number of columns of buckle groups and slot groups engaged with each other, so as to obtain different stretching degrees. Thus, an image on the printing plate can be corrected in different degrees of deviation. As a result, the alignment film pattern at different positions on the printing plate will be free from any different degrees of deviation.

The technical features described above may be combined in various suitable manners or may be replaced by equivalent technical features as long as the objective of the present disclosure can be achieved.

BRIEF DESCRIPTION OF THE DRAWINGS

The drawings described herein are for illustrative purposes only and are not intended to limit the scope of the present disclosure in any manner. In addition, the shapes and scale sizes of components in the drawings are merely illustrative and are intended to aid in understanding of the present disclosure, rather than to specifically limit the shapes and scale sizes of various parts of the present disclosure. Those skilled in the art, with the teachings of the present disclosure, may implement the present disclosure by selecting various possible shapes and scale sizes depending on specific circumstances. In the drawings.

DETAILED DESCRIPTION OF THE EMBODIMENTS

The details of the present disclosure will become more apparent from the following description with reference to the accompanying drawings and the specific embodiments of the present disclosure. However, the specific embodiments of the present disclosure described herein are for the purpose of explaining the present disclosure and are not to be construed as limiting the present disclosure in any way. The skilled artisan may contemplate any possible variations based on teachings of the present disclosure. These are to be considered as falling within the scope of the present disclosure, which will be further described below with reference to the accompanying drawings.

Figure 5:
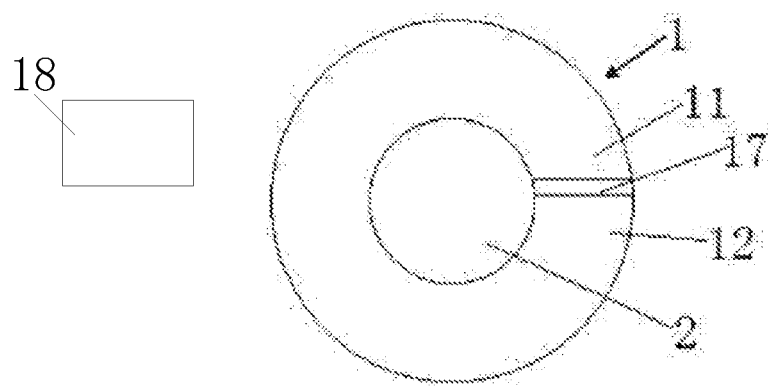
FIG. 5 schematically shows connection between a printing plate and a roller of the present disclosure.
Figure 6:
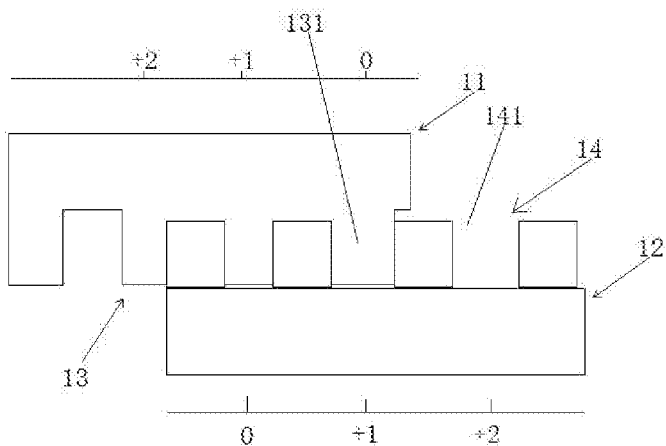
FIG. 6 schematically shows a structure in which a first end portion and a second end portion of the printing plate of the present disclosure are engaged with each other.
Figure 7:
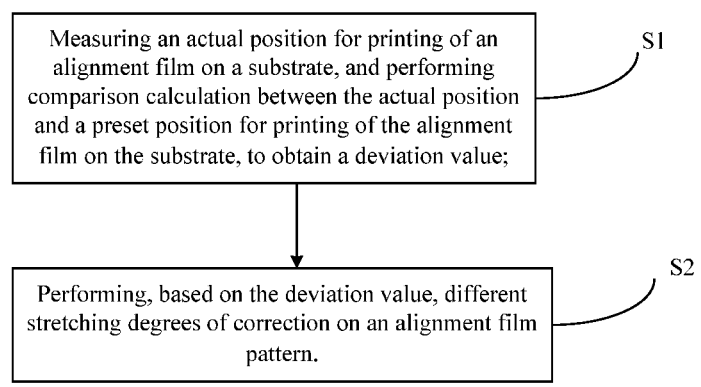
FIG. 7 is a flow chart showing a correction method of an alignment film printing plate of the present disclosure.

FIGS. 5 to 7 schematically show connection between a printing plate and a roller of the present disclosure, a structure in which a first end portion and a second end portion of the printing plate are engaged with each other, and a flow chart of a correction method of an alignment film printing plate, respectively.

As shown in FIG. 5, a printing plate 1 of the present disclosure is mounted as a sleeve outside of a roller 2. The printing plate 1 includes a first end portion 11 and a second end portion 12 that are connected to each other by means of a connecting portion 17.

FIG. 6 shows a detail view of the connecting portion 17. The first end portion 11 (printing start end) is provided thereon with a plurality of columns of buckle groups 13, and the second end portion 12 (printing end) of the printing plate 1 is provided thereon with a plurality of columns of slot groups 14 engaged with the buckle groups 13. A correction system of an alignment film printing plate of the present disclosure includes an image controller 18, which is used for measuring a deviation value between an actual position and a preset position for printing of an alignment film on a substrate. An operator can calculate a stretching length of the printing plate 1 based on the deviation value measured by the image controller 18, and determine a stretching correction degree for an alignment film pattern of the printing plate based on the stretching length.

Specifically, the buckle groups 13 include at least one buckle projection 131, and the slot groups 14 include at least one slot recess 141 engaged with the at least one buckle projection 131, to effect connection of the first end portion 11 to the second end portion 12 of the printing plate. That is, the printing plate 1 of the present disclosure connects the first end portion 11 and the second end portion 12 together by a buckle, so as to stably mount the printing plate 1 as a sleeve outside of the roller 2. In the present embodiment, the buckle groups 13 include one buckle projection 131 and the slot groups 14 include one slot recess 141. The buckle projection 131 and the slot recess 141 may be provided in other numbers, which are not specifically limited herein.

Figure 1:
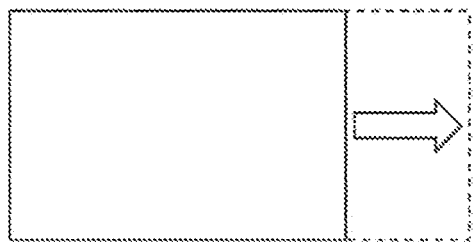
FIG. 1 schematically shows boundaries of a pattern being stretched after multiple printing in the prior art.
Figure 2:
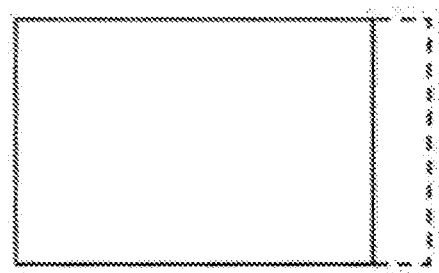
FIG. 2 schematically shows the boundaries of the pattern being stretched at a printing start end.
Figure 3:
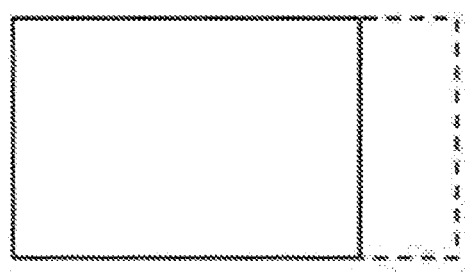
FIG. 3 schematically shows the boundaries of the pattern being stretched in a printing direction (i.e., in a direction from the printing start end to a printing end)
Figure 4:
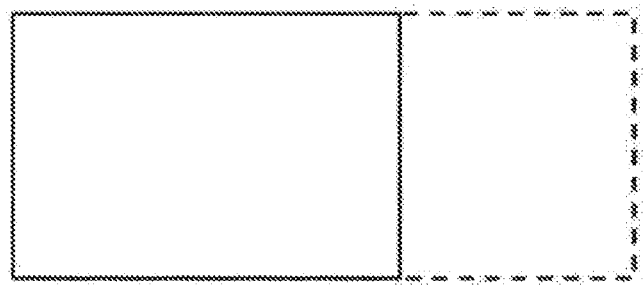
FIG. 4 schematically shows the boundaries of the pattern being stretched at a printing end.

Further, the buckle groups 13 and the slot groups 14 are respectively provided with scales. Specifically, as shown in FIG. 6, the scales on first, second, and third columns of buckle groups 13 are 0, +1, and +2, respectively; and the scales on first, second, and third columns of slot groups 14 are 0, +1, and +2, respectively. As shown in FIGS. 2 to 4, since a stretching degree of the printing plate is smaller adjacent to the printing start end than that of the printing plate adjacent to the printing end, i.e., the first end portion 11 of the printing plate 1 has a smaller stretching degree than the second end portion 12 thereof, the first end portion 11 has less correction requirements than the second end portion 12. The stretching degree in each printing direction is determined according to the deviation value between the actual position and the preset position for printing of the alignment film as indicated on a measuring substrate of the image controller 18. The operator selects the column numbers of the buckle groups 13 and the slot groups 14 that are engaged with each other according to the deviation value. Specifically, when the scale +1 of the slot groups 14 is engaged with the scale 0 of buckle groups 13, the slot groups 14 are advanced forward by one unit. Such being the case, the second end portion 12 can be subjected to a greater pulling force than the first end portion 11, so as to achieve correction of the second end portion 12 in a greater degree than that of the first end portion 11. As a result, an improved correction effect can be achieved for the printing plate, without any additional costs.

Specifically, in the present disclosure, the substrate is aligned with a correction mark provided on the printing plate at the preset position.

A correction method for an alignment film printing plate of the present disclosure comprises the following steps. In step S1), an actual position for printing of an alignment film is measured on a substrate, and comparison calculation is performed between an actual position and a preset position for printing of the alignment film on the substrate, to obtain a deviation value. In step S2), based on the deviation value, an alignment film pattern is stretched in different degrees at different positions of the printing plate.

Specifically, in the present disclosure, as shown in FIGS. 5 and 6, a printing plate 1 of the present disclosure is mounted as a sleeve outside of a roller 2. A first end portion 11 (printing start end) is provided thereon with a plurality of columns of buckle groups 13, and a second end portion 12 (printing end) of the printing plate 1 is provided thereon with a plurality of columns slot groups 14 engaged with the buckle groups 13.

Further, the buckle groups 13 include at least one buckle projection 131, and the slot groups 14 include at least one slot recess 141 engaged with the buckle projection 131, to effect connection of the first end portion 11 to the second end portion 12 of the printing plate. That is, the printing plate 1 of the present disclosure connects the first end portion 11 and the second end portion 12 together by a buckle, to form a connecting portion 17 which connects the first end portion 11 and the second end portion 12. Thus, the printing plate 1 is stably mounted as a sleeve outside of the roller 2.

Furthermore, the buckle groups 13 and the slot groups 14 are respectively provided with scales. Specifically, as shown in FIG. 6, the scales on first, second, and third columns of buckle groups 13 are 0, +1, and +2, respectively; and the scales on first, second, and third columns of slot groups 14 are 0, +1, and +2, respectively. When the scale 0 of the slot groups 14 is engaged with the scale +2 of buckle groups 13, the first end portion 11 and the second end portion 12 are subjected to a same pulling force. As shown in FIGS. 2 to 4, as a stretching degree of the printing plate is smaller adjacent to the printing start end than that of the printing plate adjacent to the printing end, i.e., the first end portion 11 of the printing plate 1 has a smaller stretching degree than the second end portion 12 thereof, the first end portion 11 has less correction requirements than the second end portion 12. The stretching degree in each printing direction is determined according to the deviation value between the actual position and the preset position for printing of the alignment film as indicated on a measuring substrate of the image controller 18. The operator selects the column numbers of the buckle groups 13 and the slot groups 14 that are engaged to each other according to the deviation value. Specifically, when the scale +1 of the slot groups 14 is engaged with the scale 0 of buckle groups 13, the slot groups 14 are advanced forward by one unit. Such being the case, there are two columns of slot groups 14 engaged with two columns of buckle groups 13, and the second end portion 12 is subjected to a greater pulling force than the first end portion 11, so as to achieve correction of the second end portion 12 in a greater degree than that of the first end portion 11. As a result, an improved correction effect can be achieved for the printing plate, without any additional costs. If it is desired to further increase the correction effect of the second end portion 12, the scale 0 of the slot groups 14 can be engaged with the scale 0 of the buckle groups 13, indicating that the slot groups 14 are advanced forward by two units. In this case, only one column of slot groups 14 are engaged with one column of buckle groups 13, to effect further increase of the correction effect of the second end 12. That is, the present disclosure achieves different stretching degrees of the pattern of the alignment film of the printing plate 1 through adjustment of the numbers of columns of the buckle groups 13 and the slot groups 14 engaged with each other. A distance between two adjacent columns of buckle groups 13 can be configured according to actual requirements, and is not specifically restricted herein.

The correction system and method of the alignment film printing plate of the present disclosure achieve different stretching degrees of the alignment pattern of the printing plate through adjustment of the numbers of columns of buckle groups 13 and slot groups 14 engaged with each other, so as to achieve different degrees of correction of the image on the printing plate via different degrees of deviation. This enables the alignment film pattern to be free from different degrees of deviation at different positions on the printing plate. The above-described technical solution is only one embodiment of the present disclosure. It is easy for a person skilled in the art to make various types of improvements or variations on the basis of the application method and principle of the present disclosure. The present disclosure is not limited to the method described in the above specific embodiment. While the present disclosure has been described with reference to preferred embodiments, various modifications may be made thereto without departing from the scope of the present disclosure, and components may be substituted with equivalents thereof. In particular, the technical features mentioned in the various embodiments may be combined in any manner as long as there is no structural conflict. The present disclosure is not limited to the specific embodiments disclosed herein, but includes all technical solutions falling within the scope of the claims.

The invention claimed is:

1. A correction system for an alignment film printing plate, comprising:
   a roller and a printing plate mounted as a sleeve outside of the roller, wherein a first end portion of the printing plate is provided thereon with a plurality of columns of buckle groups, and a second end portion of the printing plate is provided thereon with a plurality of columns of slot groups engaged with the buckle groups; and
   an image controller used for measuring a deviation value between an actual position and a preset position;
   wherein the plurality of columns of buckle groups are provided thereon with a plurality of first scales and the plurality of columns of slot groups are provided thereon with a plurality of second scales;
   a first number of columns of buckle groups and a second number of columns of slot groups are engaged with each other, an engagement between the first number of columns of buckle groups and the second number of columns of slot groups is configured to be adjusted according to the plurality of first scales and the plurality of second scales, the first number and the second number are variable and selected according to the deviation value.

2. The correction system for the alignment film printing plate according to claim 1, wherein the buckle groups include at least one buckle projection, and the slot groups include at least one buckle recess engaged with the buckle projection.

3. The correction system for the alignment film printing plate according to claim 1, wherein the first end portion is close to a printing start end, and the second end portion is close to a printing end.

4. The correction system for the alignment film printing plate according to claim 1, wherein the plurality of first scales are arranged at a side of the first end portion away from the second end portion in a form of figure, the plurality of second scales are arranged at a side of the second end portion away from the first end portion in a form of figure.

5. The correction system for the alignment film printing plate according to claim 1, wherein each first scale is arranged corresponding to a column of buckle group, each second scale is arranged corresponding to a column of slot group.

6. The correction system for the alignment film printing plate according to claim 1, wherein the plurality of the first scales are arranged according to scale values from small to large along a first direction, the plurality of the second scales are arranged according to scale values from small to large along a second direction, the first direction is opposite to the second direction.

\* \* \* \* \*